(12) United States Patent
Ogata et al.

(10) Patent No.: US 7,822,574 B2
(45) Date of Patent: Oct. 26, 2010

(54) SUBSTRATE MEASURING METHOD, COMPUTER-READABLE RECORDING MEDIUM RECORDING PROGRAM THEREON, AND SUBSTRATE PROCESSING SYSTEM

(75) Inventors: Kunie Ogata, Kikuchi-gun (JP); Shinichi Shinozuka, Koshi (JP); Yoshihiro Kondo, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 334 days.

(21) Appl. No.: 11/869,237

(22) Filed: Oct. 9, 2007

(65) Prior Publication Data

US 2008/0091381 A1   Apr. 17, 2008

(30) Foreign Application Priority Data

Oct. 12, 2006   (JP)   ............................. 2006-278797

(51) Int. Cl.
*G06F 19/00* (2006.01)
*H01L 21/66* (2006.01)

(52) U.S. Cl. .......................... 702/118; 438/14; 700/108

(58) Field of Classification Search ................ 702/118, 702/155; 700/109, 121; 438/14

See application file for complete search history.

(56) References Cited

U.S. PATENT DOCUMENTS

| | | | |
|---|---|---|---|
| 6,963,789 B2 * | 11/2005 | Bun et al. | 700/121 |
| 7,296,103 B1 * | 11/2007 | Purdy et al. | 710/106 |
| 2004/0044435 A1 * | 3/2004 | Hellig et al. | 700/214 |

FOREIGN PATENT DOCUMENTS

| | | |
|---|---|---|
| JP | 2003-209093 | 7/2003 |
| JP | 2006-128572 | 5/2006 |

* cited by examiner

*Primary Examiner*—Bryan Bui
(74) *Attorney, Agent, or Firm*—Oblon, Spivak, McClelland, Maier & Neustadt, L.L.P.

(57) ABSTRACT

In the present invention, substrates in a plurality of lots are successively processed in a coating and developing treatment system, and line width measurement is performed for some of substrates of the substrate which have been through processing in each lot. The line width measurement of two successive lots is performed such that the last line width measurement in the previous lot of the two successive lots has been completed at the time of completion of processing of a substrate which is first subjected to the line width measurement in the subsequent lot. According to the present invention, the measurement of product substrates can be performed without decreasing the throughput of the product substrates.

3 Claims, 9 Drawing Sheets

SUBSTRATE MEASURING METHOD, COMPUTER-READABLE RECORDING MEDIUM RECORDING PROGRAM THEREON, AND SUBSTRATE PROCESSING SYSTEM

BACKGROUND OF THE INVENTION

1. Field of the Invention

The present invention relates to a substrate measuring method, a computer-readable recording medium recording a program thereon, and a substrate processing system.

2. Description of the Related Art

In a photolithography step in manufacturing process, for example, of a semiconductor device, for example, a plurality of steps such as a resist coating step of applying a resist solution onto a wafer to form a resist film, an exposure step of exposing the resist film into a predetermined pattern, a heating step of accelerating the chemical reaction in the resist film after exposure (post-exposure baking), and a developing step of developing the exposed resist film are performed in sequence, so that a predetermined resist pattern is formed on the wafer. The series of processing is performed in a coating and developing treatment system incorporating various kinds of processing and treatment units and wafer transfer units. Into the coating and developing treatment system, for example, the wafers are transferred from the outside as a unit of cassette (lot), and the wafers in a plurality of lots are successively transferred and processed.

Incidentally, to grasp, for example, the tendency within the wafer after the above-described series of processing, it is necessary to measure the processing state of the wafer such as the line width or the like of the resist pattern in the above-described coating and developing treatment system. The measurement of the wafer is performed by processing a test wafer before processing of a product wafer, for example, in the coating and developing treatment system and measuring the processing states at a plurality of measurement points on the test wafer surface, for example, by a measuring unit incorporated in the coating and developing treatment system (see Japanese Patent Application Laid-open No. 2006-128572 and JP No. 2003-209093).

However, when the wafer processing state is measured using the test wafer as described above, it takes a long time to start processing of the product wafer because the processing of the product wafer is started after the measurement of the test wafer. For this reason, it is demanded to directly measure the processing state using the product wafer.

When using the product wafer, the product wafer will be measured after the product wafer is processed in the coating and developing treatment system. However, since product wafers in a plurality of lots are successively processed at a fixed throughput in the coating and developing treatment system, when the product wafers in the previous lot of two successive lots have been through the last step and the product wafers are then subjected to measurement, and in addition, and if it would have taken a long time for the measurement, the measurement of the product wafers in the lot subsequent thereto cannot be immediately performed even if the wafers in the subsequent lot have been through the processing. In this case, time to keep the product wafers in the subsequent lot waiting is generated, thus causing congestion of the successively processed product wafers, resulting in decreased throughput of the product wafers.

SUMMARY OF THE INVENTION

The present invention has been developed in consideration of the above points, and its object is to measure successively transferred product substrates without decreasing the throughput of the product substrates such as product wafers.

To achieve the above object, the present invention is a substrate measuring method of measuring processing states of a plurality of substrates, the substrates having been successively transferred from a plurality of set lots and subjected to processing, each of the lots including a plurality of substrates, wherein some of the substrates of the plurality of substrates in each of the lots are selected and subjected to substrate measurement. The substrate measurement is performed such that the measurement of a last substrate in a previous lot of the two successive lots has been completed at the time of completion of processing of a substrate which is first subjected to the substrate measurement in a subsequent lot.

According to the present invention, the first substrate measurement in the subsequent lot of the two successive lots can be performed immediately after the completion of the substrate processing. As a result, this prevents the substrates in the subsequent lot from being kept waiting due to substrate measurement of the previous lot to cause congestion of the substrates, so that measurement of product substrates can be performed without decreasing the throughput of the product substrates. Further, the substrate measurement is performed for at least one product substrate for each lot, ensuring high reliability of measurement.

If processing recipes for the two successive lots are the same, and there are N processing units (where N is a positive integer) which perform the same step in the processing, and the successively transferred substrates are separated and processed in the N processing units, the substrate measurement may be performed for the N substrates which have been processed in different processing units, and the substrate measurement of some of the substrates of the substrate measurement of the N substrates may be performed in the substrate measurement of the previous lot of the two successive lots, and the substrate measurement of the remaining substrates of the N substrates may be performed in the substrate measurement of the subsequent lot.

If processing recipes for the two successive lots are the same, and there are N processing units (where N is a positive integer) which perform the same step in the processing, and the successively transferred substrates are separated and processed in the N processing units, the substrate measurement may be performed for the substrates which have been processed in each of the processing units, and the substrate measurement of the N substrates which have been processed in different processing units may be performed to perform measurement at some of measurement points of a plurality of measurement points within the substrate of each of the substrates in the substrate measurement of the previous lot of the two successive lots, the measurement at the remaining measurement points of each of the N substrates may be performed in the substrate measurement of the subsequent lot, and measurement results at each of the measurement points of the substrates which have been processed in the same processing unit may then be combined.

Such a substrate measuring method can be embodied as a computer program running in a control unit, the control unit controlling a substrate measuring method, for example, in a substrate processing system including a substrate processing unit and a measuring unit, and such a computer program may be recorded, for example, on a computer-readable recording medium.

The present invention according to another aspect is a substrate processing system including a substrate processing unit and a measuring unit, for successively transferring and processing substrates from a plurality of lots, each of the lots including a plurality of substrates, and measuring processing states of the substrates which have been through the processing, wherein some of the substrates of the plurality of substrates in each of the lots are selected and subjected to substrate measurement, and the system includes a control unit for controlling the substrate measurement of two successive lots such that the measurement of a last substrate in a previous lot of the successive lots has been completed at the time of completion of processing of a substrate which is first subjected to the substrate measurement in a subsequent lot.

According to the present invention, measurement of product substrates can be performed without decreasing the throughput of the product substrates.

DETAILED DESCRIPTION OF THE INVENTION

Figure 1:
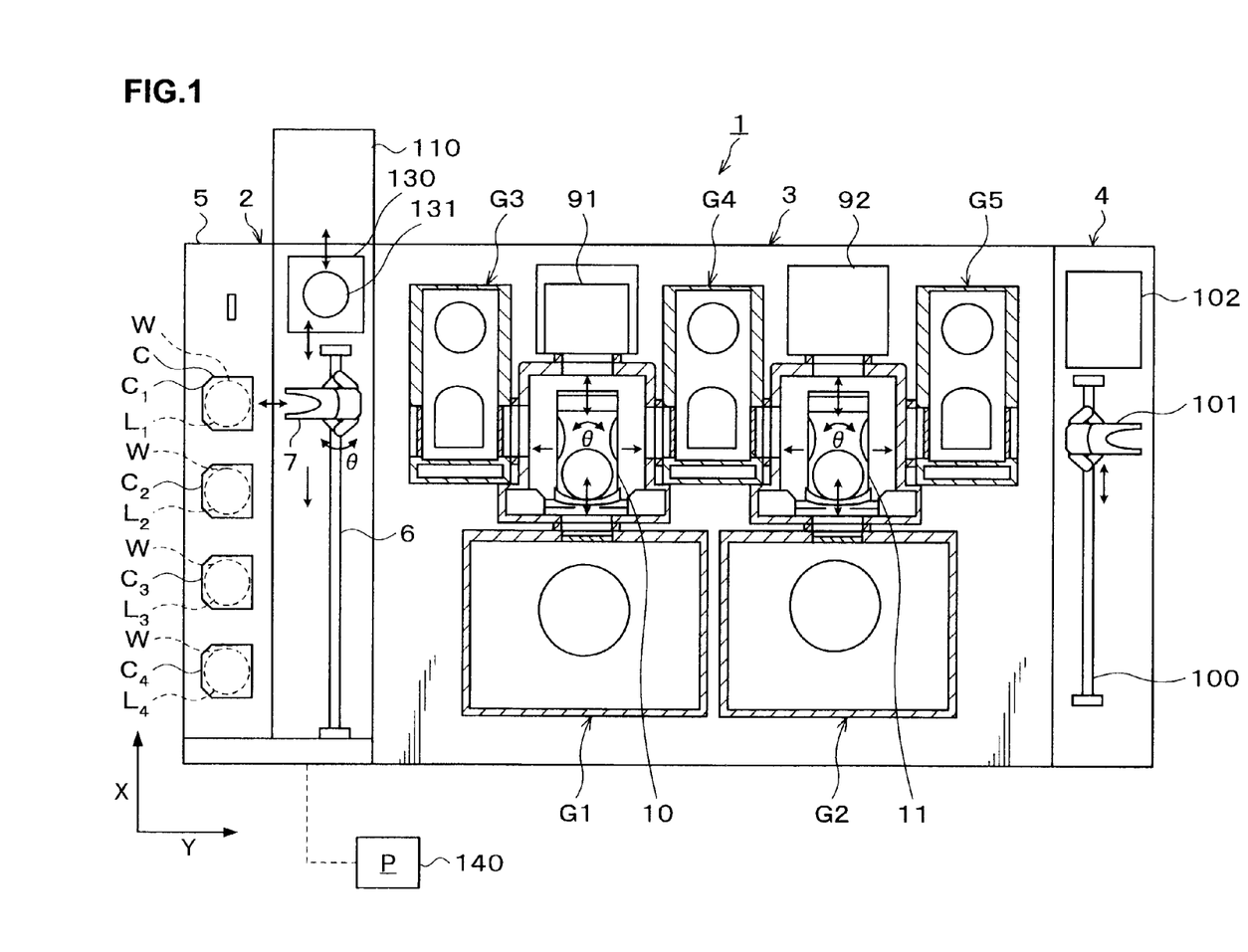
FIG. 1 is a plan view showing the outline of a configuration of a coating and developing treatment system.
Figure 2:
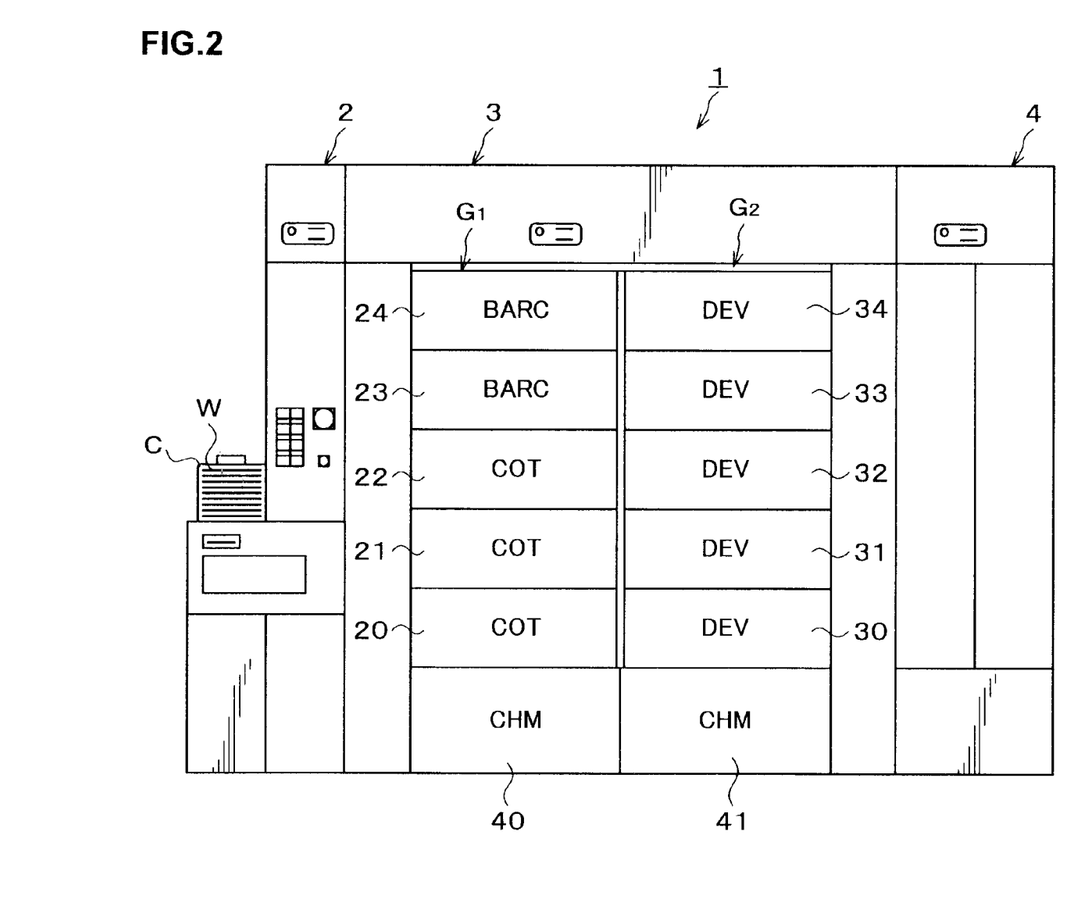
FIG. 2 is a front view of the coating and developing treatment system in FIG. 1.
Figure 3:
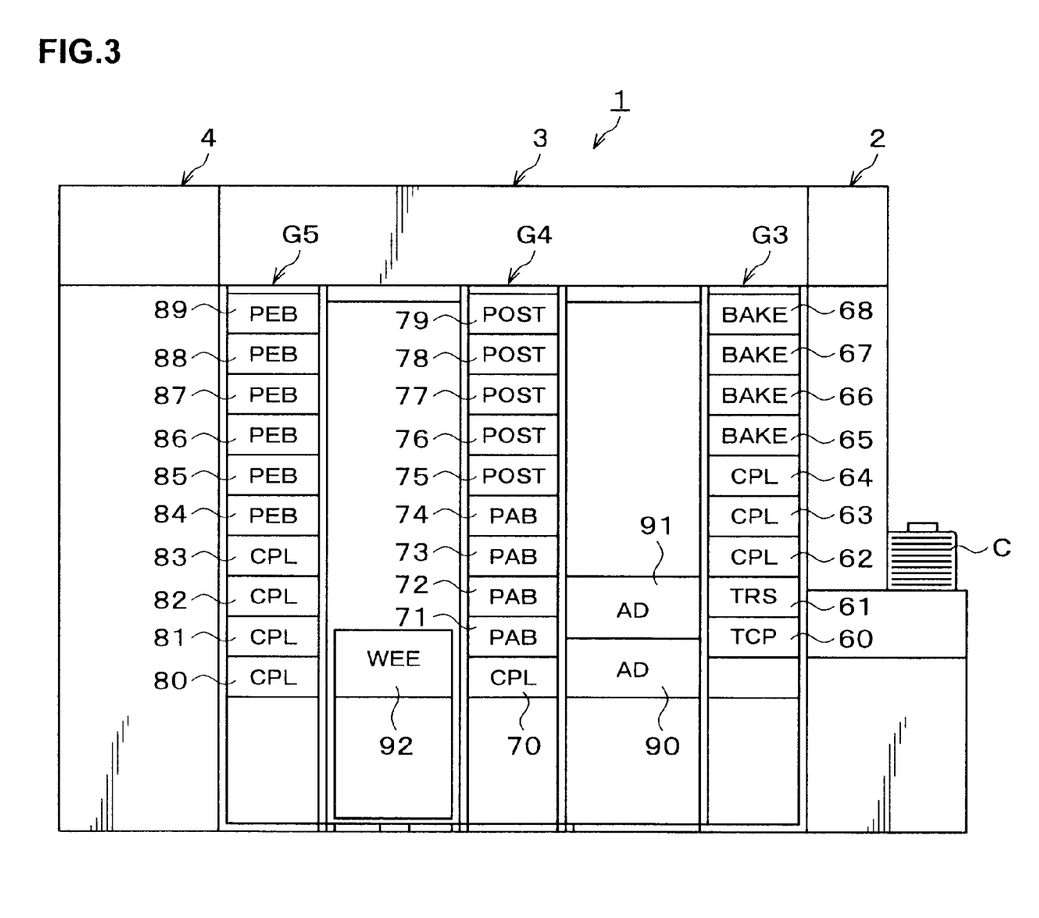
FIG. 3 is a rear view of the coating and developing treatment system in FIG. 1.

Hereinafter, preferred embodiments of the present invention will be described. FIG. 1 is a plan view showing the outline of a configuration of a coating and developing treatment system 1 as a substrate processing system in which a substrate processing method according to the embodiments is performed, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring, for example, 25 wafers W per cassette as a unit from/to the outside into/from the coating and developing treatment system 1 and transferring the wafers W into/out of a cassette C; a processing station 3 including a plurality of various kinds of processing and treatment units, which are multi-tiered, for performing predetermined processing or treatment in a manner of single wafer processing in the photolithography process; and an interface station 4 for delivering the wafers W to/from a not-shown aligner provided adjacent to the processing station 3, are integrally connected together.

In the cassette station 2, a cassette mounting table 5 is provided and configured such that a plurality of cassettes C can be mounted thereon in a line in an X-direction (a top-to-bottom direction in FIG. 1). In the cassette station 2, a wafer transfer body 7 is provided which is movable in the X-direction on a transfer path 6. The wafer transfer body 7 is also movable in an arrangement direction of the wafers W housed in the cassette C (a Z-direction; the vertical direction), and thus can selectively access the wafers W in each of the cassettes C arranged in the X-direction.

The wafer transfer body 7 is rotatable in a θ-direction around a Z-axis, and can access a temperature regulating unit 60 and a transition unit 61 included in a later-described third processing unit group G3 on the processing station 3 side.

The processing station 3 adjacent to the cassette station 2 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side.

On the side of the positive direction in the X-direction (the upward direction in FIG. 1) in the processing station 3, the third processing unit group G3, the fourth processing unit group G4, and the fifth processing unit group G5 are placed in order from the cassette station 2 side. Between the third processing unit group G3 and the fourth processing unit group G4, a first transfer unit 10 is provided. The first transfer unit 10 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 11 is provided. The second transfer unit 11 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 20, 21, and 22 each for applying a resist solution to the wafer W, and bottom coating units 23 and 24 each for forming an anti-reflection film that prevents reflection of light at the time of exposure processing, are five-tiered in order from the bottom. In the second processing unit group G2, solution treatment units, for example, developing treatment units 30 to 34 each for supplying a developing solution to the wafer W to develop it are five-tiered in order from the bottom. Further, chemical chambers 40 and 41 for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, the temperature regulating unit 60, the transition unit 61 for passing the wafer W, high-precision temperature regulating units 62 to 64 each for regulating the temperature of the wafer W under a high precision temperature control, and high-temperature thermal processing units 65 to 68 each for heat-processing the wafer W at a high temperature, are nine-tiered in order from the bottom.

In the fourth processing unit group G4, for example, a high-precision temperature regulating unit 70, pre-baking units 71 to 74 each for heat-processing the wafer W after resist coating treatment, and post-baking units 75 to 79 each for heat-processing the wafer W after developing treatment, are ten-tiered in order from the bottom.

In the fifth processing unit group G5, a plurality of thermal processing units each for thermally processing the wafer W, for example, high-precision temperature regulating units 80 to 83, and post-exposure baking units (hereinafter, referred to as "PEB units") 84 to 89 each for heat-processing the wafer W after exposure and before development, are ten-tiered in order from the bottom.

As shown in FIG. 1, on the positive direction side in the X-direction to the first transfer unit 10, a plurality of processing and treatment units are arranged, for example, adhesion units 90 and 91 each for performing hydrophobic treatment on the wafer W being two-tiered in order from the bottom as shown in FIG. 3. As shown in FIG. 1, on the positive side in the X-direction to the second transfer unit 11, for example, an edge exposure unit 92 is disposed which selectively exposes only the edge portion of the wafer W to light.

In the interface station 4, for example, a wafer transfer body 101 moving on a transfer path 100 extending in the X-direction and a buffer cassette 102 are provided as shown in FIG. 1. The wafer transfer body 101 is movable in the vertical direction and also rotatable in the O-direction, and thus can access the aligner (not shown) adjacent to the interface station 4, the buffer cassette 102, and the fifth processing unit group G5 and transfer the wafer W to them.

Figure 4:
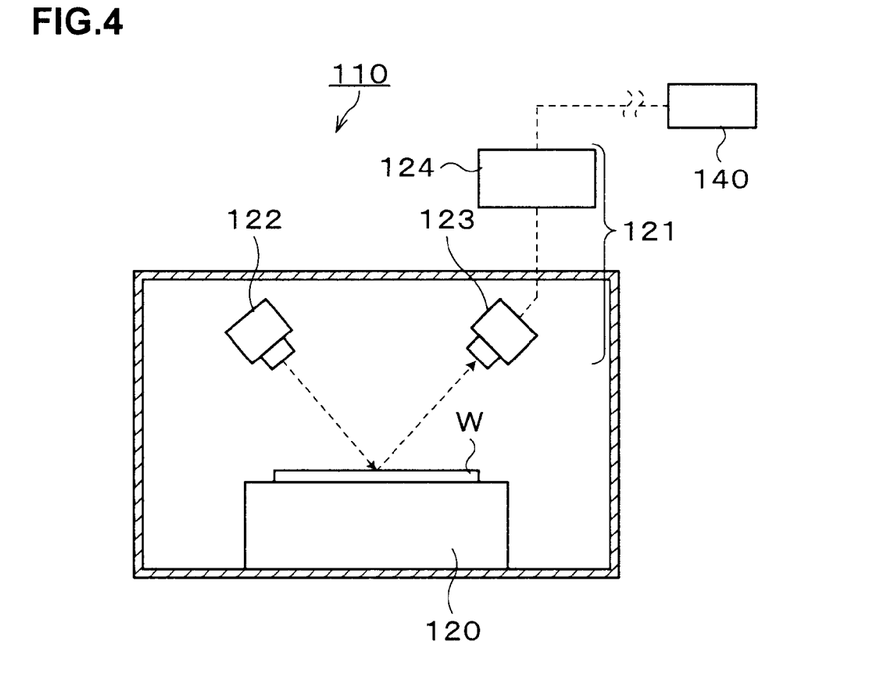
FIG. 4 is a longitudinal-sectional view showing the outline of a configuration of a line width measuring unit.

In the cassette station 2, for example, a line width measuring unit 110 for measuring the line width of a resist pattern on the wafer W is provided. The line width measuring unit 110 includes, for example, a mounting table 120 for horizontally mounting the wafer W thereon and an optical profilometer 121 as shown in FIG. 4. The mounting table 120 is, for example, an X-Y stage and can move to any position in two dimensional directions in the horizontal directions.

The optical profilometer 121 includes, for example, a light irradiation unit 122 for applying light to the wafer W in an oblique direction, a light detection unit 123 for detecting the light applied from the light irradiation unit 122 and reflected by the wafer W, and a calculation unit 124 for calculating the dimension of the resist pattern on the wafer W based on light reception information from the light detection unit 123. The line width measuring unit 110 according to this embodiment is for measuring the line width of the resist pattern, for example, using the Scatterometry method, in which the line width of the resist pattern can be measured in the calculation unit 124 by checking the light intensity distribution within the wafer detected by the light detection unit 123 against a virtual light intensity distribution stored in advance and obtaining a line width of the resist pattern corresponding to the checked virtual light intensity distribution.

Figure 5:
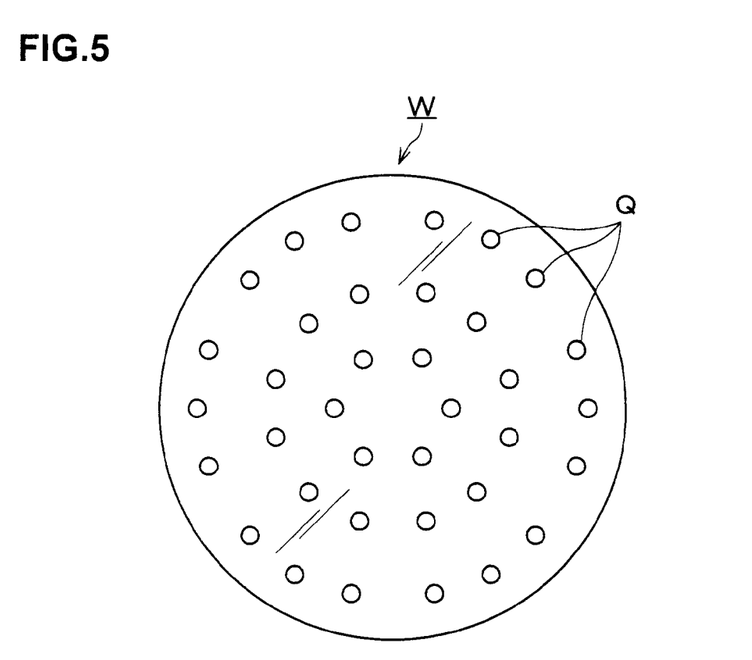
FIG. 5 is an explanatory view showing a plurality of measurement points within a wafer.

The line width measuring unit 110 can measure the line widths at a plurality of locations within the wafer, for example, at a plurality of measurement points Q as shown in FIG. 5 by horizontally moving the wafer W relative to the light irradiation unit 122 and the light detection unit 123. The measurement result of the line width measuring unit 110 can be outputted, for example, from the calculation unit 124 to a later-described control unit 140.

In the cassette station 2, for example, a transition unit 130 for passing the wafer W between the line width measuring unit 110 and the wafer transfer body 7 is provided as shown in FIG. 1. In the transition unit 130, mounting tables 131 are provided at two, upper and lower, tiers so that the wafer W passed from the wafer transfer body 7 to the line width measuring unit 110 is mounted on the mounting table 131 at the upper tier and the wafer W passed from the line width measuring unit 110 to the wafer transfer body 7 is mounted on the mounting table 131 at the lower tier. Note that the transfer of the wafer W between the line width measuring unit 110 and the transition unit 130 is performed, for example, by a not-shown wafer transfer unit.

The wafer transfer management to perform wafer processing and line width measurement in the coating and developing treatment system 1 configured as described above is controlled, for example, by the control unit 140 shown in FIG. 1. The control unit 140 is composed of, for example, a general-purpose computer comprising a CPU and a memory, and can execute a program P stored in a storage unit to control the wafer processing and the line width measurement. Note that the program P in the control unit 140 may be one installed into the control unit 140 by means of a computer-readable recording medium.

Next, the process of processing the wafer and the process of measuring the line width of the wafer in the coating and developing treatment system 1 configured as described above will be described. First of all, a plurality of cassettes C, for example, four cassettes $C_1$, $C_2$, $C_3$, and $C_4$ are mounted on the cassette mounting table 5 in the cassette station 2 as shown in FIG. 1. In each of the cassettes $C_1$ to $C_4$, a plurality of product wafers are housed. Note that a group of a plurality of wafers housed in the same cassette is called a lot, and the plurality of wafers W in the cassettes $C_1$ to $C_4$ constitute lots $L_1$, $L_2$, $L_3$, and $L_4$, respectively in this embodiment.

The wafers W in each of the cassettes $C_1$ to $C_4$ are taken out one by one by the wafer transfer body 7, and transferred in succession to the temperature regulating unit 60 included in the third processing unit group G3 in the processing station 3. The wafers W transferred to the temperature regulating unit 60 are temperature-regulated to a predetermined temperature, and then transferred in succession by the first transfer unit 10 to the bottom coating unit 23, where an anti-reflection film is formed thereon.

The wafers W having the anti-reflection film formed thereon are transferred by the first transfer unit 10 to the high-temperature thermal processing unit 65 and the high-precision temperature regulating unit 70 in sequence so that predetermined processing is performed in each of the units. Thereafter, the wafers W are transferred in succession to the resist coating unit 20 where a resist film is formed on the wafers W, and then transferred by the first transfer unit 10 to the pre-baking unit 71 and subjected to pre-baking. The wafers W are subsequently transferred by the second transfer unit 11 to the edge exposure unit 92 and the high-precision temperature regulating unit 83 in sequence so that the wafers W are subjected to predetermined processing in each of the units. The wafers W are then transferred by the wafer transfer body 101 in the interface station 4 to the not-shown aligner, where the wafers are exposed to light.

The wafer W for which exposure processing has been finished is transferred by the wafer transfer body 101, for example, to the PEB unit 84, where the wafer W is subjected to post-exposure baking, and then transferred by the second transfer unit 11 to the high-precision temperature regulating unit 81, where the wafer W is temperature-regulated. The wafer W is transferred to the developing treatment unit 30, where the resist film on the wafer W is developed. The wafer W for which the developing treatment has been finished is then transferred by the second transfer unit 11 to the post-baking unit 75, where the wafer W is subjected to post-baking. The wafer W is then transferred to the high-precision temperature regulating unit 63, where the wafer W is temperature-regulated. The wafer W is then transferred by the first transfer unit 10 to the transition unit 61 and returned to the cassette C by the wafer transfer body 7, thus completing wafer processing S1 (shown in FIG. 6) that is resist pattern forming processing.

Figure 6:
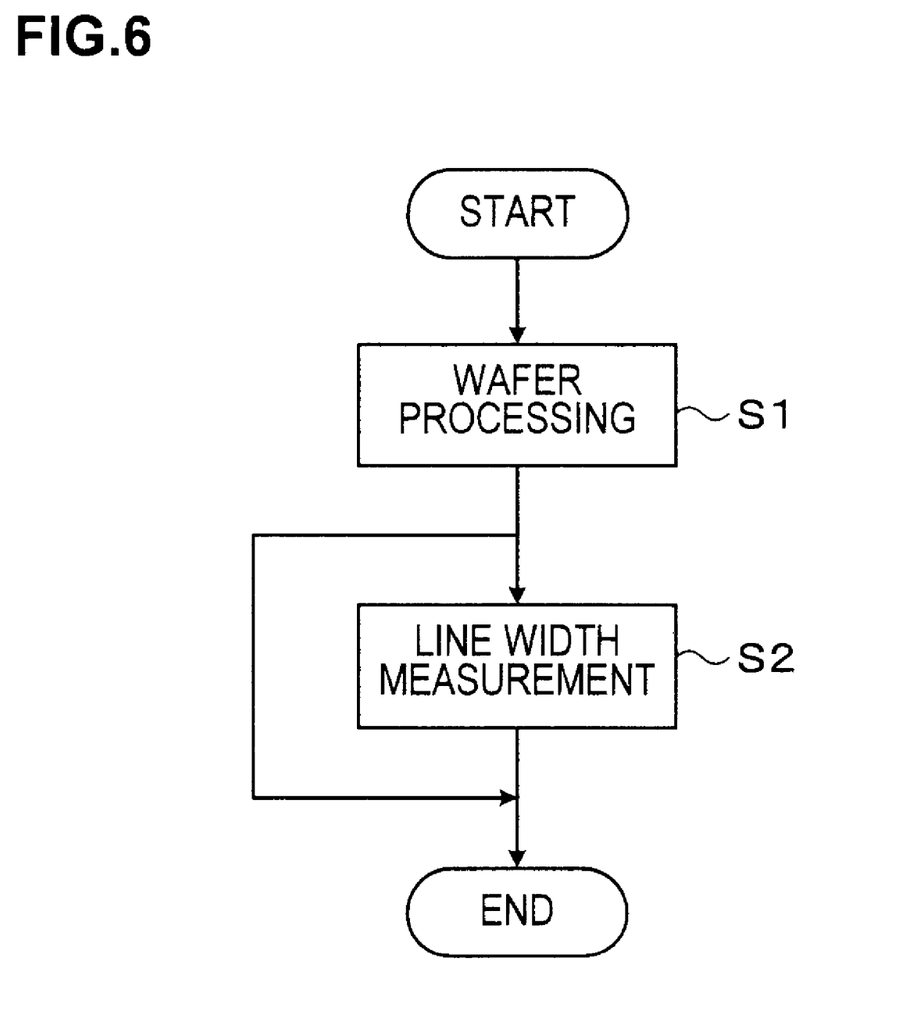
FIG. 6 is a flowchart of processing performed in the coating and developing treatment system.

As shown in FIG. 6, for some of the wafers W, line width measurement S2 is performed subsequent to the completion of the wafer processing S1. The wafer W subjected to the line width measurement is passed by the wafer transfer body 7 from the cassette C to the transition unit 130, and from the transition unit 130 to the line width measuring unit 110. The wafer W transferred to line width measuring unit 110 is mounted on the mounting table 120 as shown in FIG. 4. Then, light is applied from the light irradiation unit 122 to a predetermined portion of the wafer surface, its reflected light is detected by the light detection unit 123, and the line width of the resist pattern on the wafer W is calculated in the calculation unit 124. In this line width measuring unit 110, the wafer W is horizontally moved relative to the light irradiation unit 122 and the light detection unit 123, so that the line widths at a plurality of measurement points Q within the wafer are measured as shown in FIG. 5.

The wafer W for which the line width measurement S2 has been completed is passed again to the transition unit 130, and returned from the transition unit 130 to the original cassette C, with which a series of processing in the coating and developing treatment system 1 ends.

The remaining wafers W for which the line width measurement S2 is not performed are kept waiting in the cassette C as they are after the completion of the wafer processing S1 as shown in FIG. 6, with which a series of processing in the coating and developing treatment system 1 ends.

Figure 7:
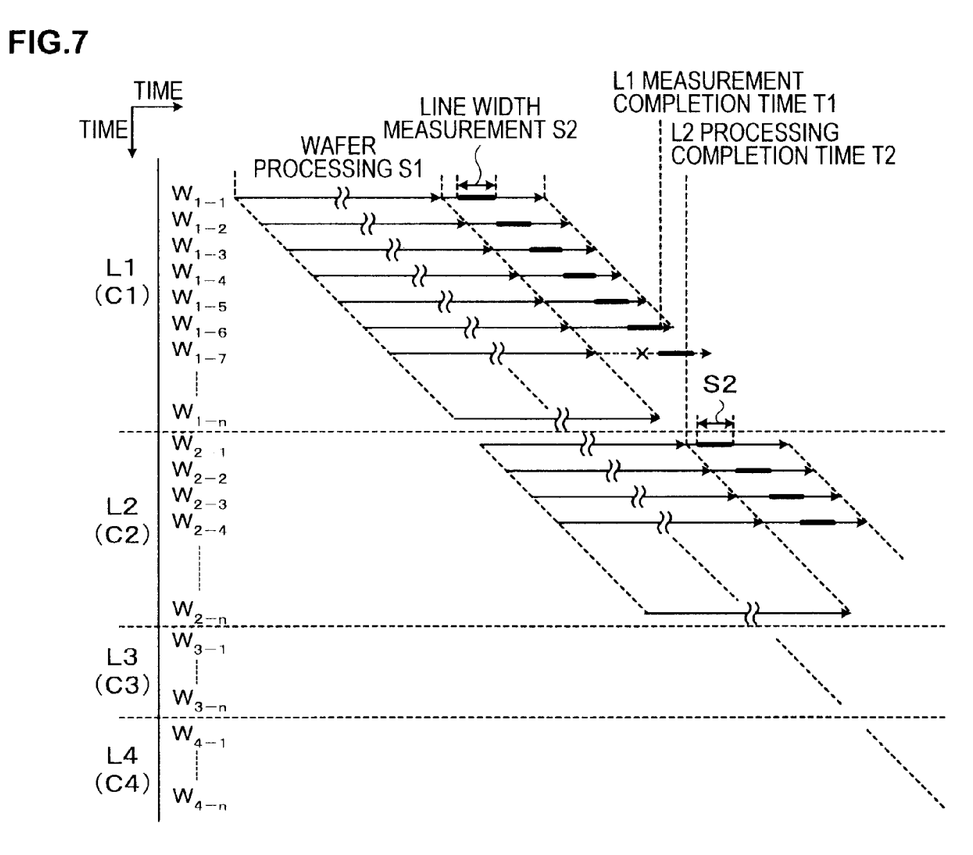
FIG. 7 is a time chart for processing wafers in a plurality of lots.

In the above-described coating and developing treatment system 1, the lots $L_1$, $L_2$, $L_3$, and $L_4$ in the cassettes $C_1$ to $C_4$ are successively processed in this order, for example, as shown in FIG. 7. The successive processing of the lots $L_1$ to $L_4$ in the coating and developing treatment system 1 is managed such that the throughput indicating the number of processed wafers per unit time is fixed, so that, for example, all of the wafers $W_{1-1}$ to $W_{1-n}$, $W_{2-1}$ to $W_{2-n}$, $W_{3-1}$ to $W_{3-n}$, and $W_{4-1}$ to $W_{4n}$ in the lots $L_1$ to $L_4$ are successively transferred at an almost regular intervals and processed.

Under such a transfer control of the wafers, the line width measurement processing schedule and the number of wafers for line-width measurement of the lots $L_1$ to $L_4$ are set so that the line width measurement S2 last performed in the previous lot of two successive lots has been finished at the time when the wafer processing S1 of the wafer W that is first subjected to the line width measurement S2 in the subsequent lot.

It should be noted that the line width measurement S2 here refers to processing of actually performing line width measurement in the line width measuring unit 110, and thus the time required for the line width measurement S2 does not include the time from when the wafer W is passed to the transition unit 130 till when it is transferred from the transition unit 130 to the line width measuring unit 110 nor the time when the wafer is kept waiting on the mounting table 131. Note that in FIG. 7, an arrow on the time axis subsequent to the wafer processing S1 indicates the duration of the time including such the time from when the wafer W is passed to the transition unit 130 till when it is transferred from the transition unit 130 to the line width measuring unit 110 and the time when the wafer is kept waiting on the mounting table 131, and the time required for the line width measurement S2 is indicated by a thick portion on the arrow (similarly in FIG. 8 and FIG. 9).

In the case where the line width measurement S2 is performed for the first wafer $W_{2-1}$ in the lot $L_2$ as shown in FIG. 7, if the line width measurement S2 is performed for the seventh wafer $W_{1-7}$ in the lot $L_1$, a completion time T1 of the line width measurement S2 of the wafer $W_{1-7}$ is later than a completion time T2 of the wafer processing S1 of the wafer $W_{2-1}$ in the lot $L_2$. Hence, setting is made such that the wafers W up to sixth wafer $W_{1-6}$ in the lot $L_1$ are selected and subjected to line width measurement in this embodiment.

As described above, the numbers of wafers to be subjected to line width measurement in the lot $L_1$ and the number of the wafers, and the number of wafer to be first subjected to line width measurement in the lot $L_2$, the throughput of the wafer processing S1 and so on are determined for the two successive lots $L_1$ and $L_2$ so that, for example, the completion time T1 of the line width measurement S2 of the last wafer $W_{1-6}$ in the lot $L_1$ is earlier than the completion time T2 of the wafer processing S1 of the wafer $W_{2-1}$ that is first subjected to the line width measurement S2 in the lot $L_2$. These settings are made, for example, by the control unit 140. Note that setting is similarly made for the two successive lots $L_2$ and lot $L_3$, and for lot $L_3$ and lot $L_4$.

According to this embodiment, since the line width measurement S2 of all of the wafers W which are selected to be subjected to line width measurement in the previous lot is completed by the time when the wafer processing S1 of the wafer W which is first subjected to line width measurement in the subsequent lot of the two successive lots is completed, the wafer W to be first subjected to line width measurement S2 in the subsequent lot can be subjected to the line width measurement S2 immediately after the completion of the wafer processing S1. As a result, the waiting time for the line width measurement S2 of the subsequent lot of the two successive lots is eliminated to cause no congestion of the wafers, so that even if the line width measurement is performed using product wafers in the coating and developing treatment system 1, the processing of the wafers can be performed without decreasing the usual throughput.

Note that though the line width measurement is performed for the wafers in order from the first wafer $W_{1-1}$ in the lot $L_1$ in the above embodiment, it is only necessary to satisfy the condition that the completion time T1 of the last line width measurement S2 in the lot $L_1$ is earlier than the completion time T2 of the wafer processing S1 of the wafer W which is first subjected to the line width measurement in the lot $L_2$, so it is not always necessary to perform the line width measurement of the wafers starting from the first wafer $W_{1-1}$ in the lot $L_1$ but it is adoptable to start the line width measurement of the wafers from the second or subsequent wafer W as long as the condition is satisfied. Also for the lot $L_2$, it is not always necessary to perform the line width measurement starting from the first wafer $W_{2-1}$, but it is adoptable to perform the line width measurement from the second or subsequent wafer W. This applies to the lots $L_3$ and $L_4$. In addition, the number of wafers to be subjected to the line width measurement in each of the lots $L_1$ to $L_4$ can be arbitrarily selected according to the purpose.

If processing recipes for two successive lots are the same, and there are N processing units (where N is a positive integer) which perform the same step in the wafer processing S1, and a plurality of wafers successively transferred are separately processed in the N processing units in the coating and developing treatment system 1 described in the above embodiment, the line width measurement may be performed for N wafers which have been processed in different processing units. This is necessary to check whether processing results are approvable because the processing results of the wafers may differ from each other when the wafers pass through the different processing units. In this case, the line width measurement may be performed for some of the wafers W of the line width measurement of the N wafers W in the line width measurement of the previous lot of two successive lots, and the line width measurement may be performed for the remaining wafers W in the N wafers W in the line width measurement of the subsequent lot.

Figure 8:
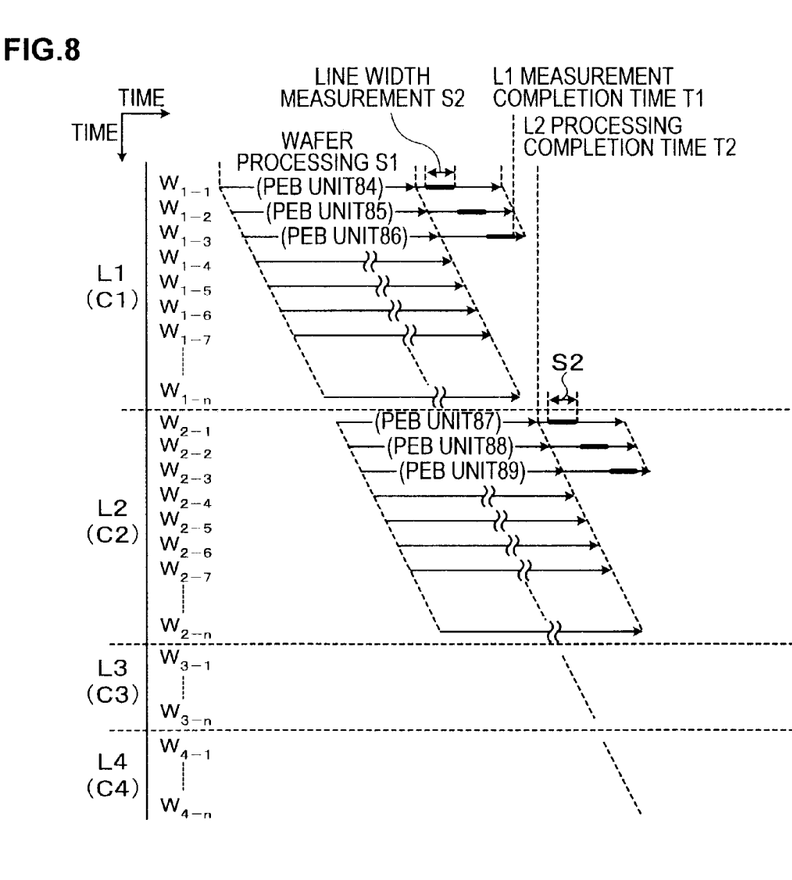
FIG. 8 is a time chart for processing the wafers in the plurality of lots when the throughput is increased.

For example, if six PEB units 84 to 89 are provided and wafers W to be successively transferred are separated into the PEB units 84 to 89 as described in the above embodiment, the line width measurement S2 is performed, for example, for the wafers $W_{1-1}$, $W_{1-2}$, and $W_{1-3}$ which have been processed through the PEB units 84, 85, and 86 in the lot $L_1$ as shown in FIG. 8. Then, the line width measurement S2 is performed for the wafers $W_{2-1}$, $W_{2-2}$, and $W_{2-3}$ which have been processed through the other PEB units 87, 88, and 89 in the lot $L_2$. This ensures that the line width measurement S2 of the six wafers W which have been processed through the PEB units 84 to 89 can be performed over two lots, resulting in the decreased number of times of the line width measurement S2 in the lots $L_1$ and $L_2$. Accordingly, it becomes possible to increase the processing speed of the wafers W even under the above-described condition that the completion time T1 of the last line width measurement S2 in the lot $L_1$ is earlier than the completion time T2 of the wafer processing S1 of the wafer W which is first subjected to the line width measurement in the lot $L_2$.

More specifically, as compared to the case where the line width measurement is performed, for example, six times in one lot $L_1$ as in the above embodiment shown in FIG. 7, the line width measurement S2 in the lot $L_1$ is necessary to be performed only three times as shown in FIG. 8 in this embodiment and the wafers W can be accordingly processed about twice throughput. As described above, according to this example, the throughput in the coating and developing treatment system 1 can be increased.

Note that the number of PEB units is not limited to that in this example. In addition, this embodiment is also applicable to the case where there are a plurality of processing units for performing steps other than the PEB step in the wafer processing S1.

Further, in the above embodiment where a plurality of wafers W successively transferred are separated and processed in the N processing units which perform the same step and the line width measurement is performed for the wafers W processed in the processing units, it is adoptable to perform the line width measurement of the N wafers W which have been processed in different processing units to perform measurement at some of measurement points of a plurality of measurement points within the wafer of each of the wafers W in the line width measurement in the previous lot of the two successive lots, perform the measurement at the remaining measurement points of each of the N wafers W in the line width measurement in the subsequent lot, and then combine the measurement results at each measurement point of the wafers W which have been processed in the same processing unit.

Figure 9:
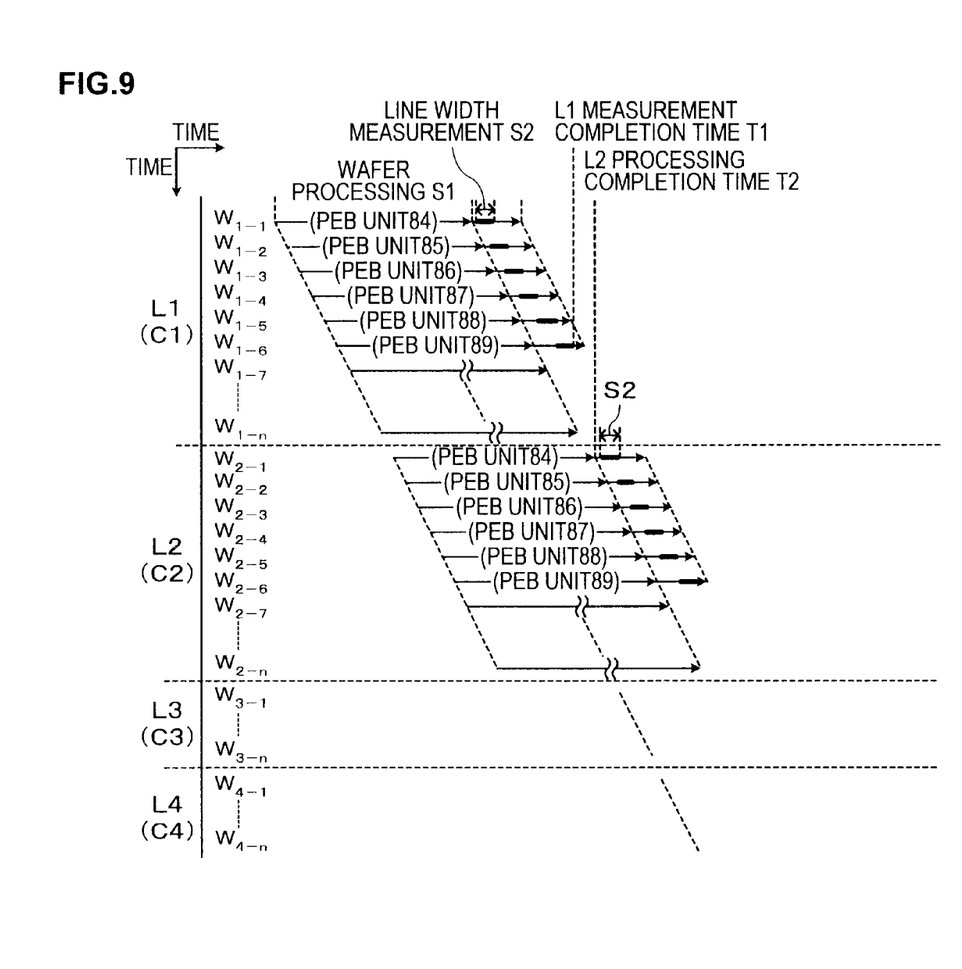
FIG. 9 is a time chart for processing the wafers in the plurality of lots when the throughput is increased.
Figure 10:
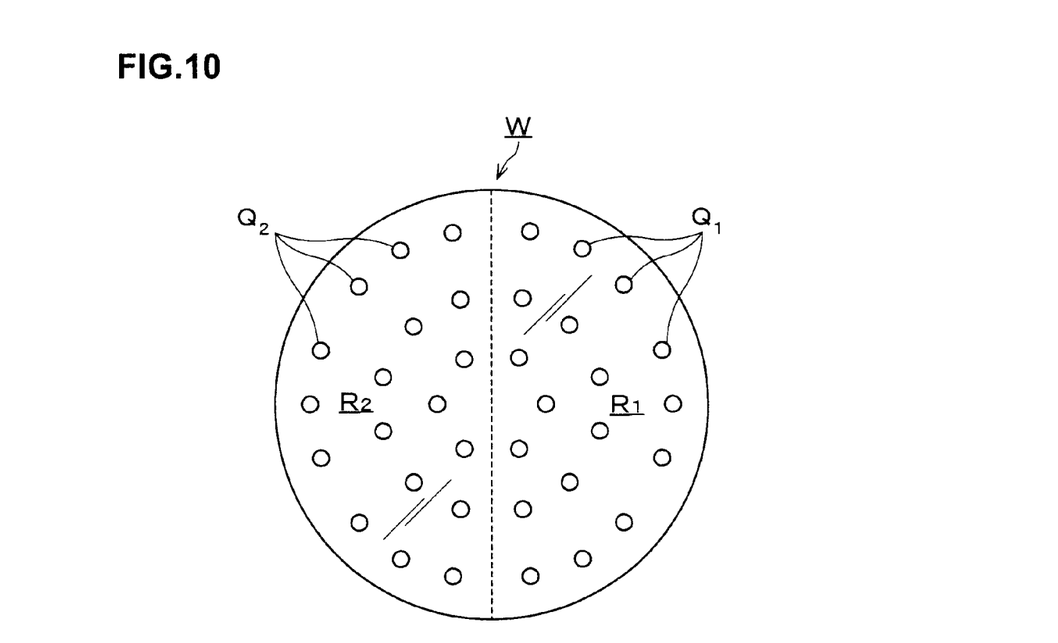
FIG. 10 is an explanatory view showing divided regions of the plurality of measurement points within the wafer.

For example, if six PEB units 84 to 89 are provided and wafers W to be successively transferred are separated into the PEB units 84 to 89 as described, the line width measurement S2 is first performed, for example, for the wafers $W_{1-1}$, $W_{1-2}$, $W_{1-3}$, $W_{1-4}$, $W_{1-5}$, and $W_{1-6}$ which have been processed through the PEB units 84 to 89 in the previous lot $L_1$ as shown in FIG. 9. The line width measurement S2 of the wafers $W_{1-1}$ to $W_{1-6}$ is performed such that the line widths are measured at measurement points Q1 within a wafer region $R_1$ that is one of two semicircular portions made by, for example, equally dividing the wafer surface as shown in FIG. 10. Then, the line width measurement S2 is performed for the wafers $W_{2-1}$, $W_{2-2}$, $W_{2-3}$, $W_{2-4}$, $W_{2-5}$, and $W_{2-6}$ which have been processed through the PEB units 84 to 89 in the subsequent lot $L_2$. The line width measurement S2 of the wafers $W_{2-1}$ to $W_{2-6}$ is performed such that the line widths are measured at measurement points $Q_2$ within the other wafer region $R_2$ of the wafer surface shown in FIG. 10.

Figure 11:
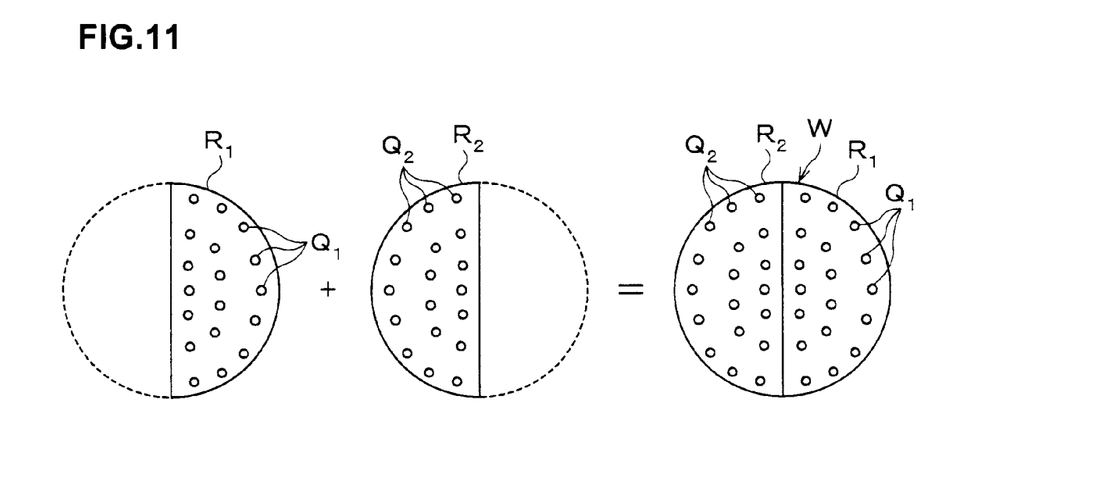
FIG. 11 is an explanatory view showing an example of combining measurement results of two wafers.

The line width measurement results of the wafers W in the lots $L_1$ and $L_2$ are outputted to the control unit 140. In the control unit 140, the line width measurement results at the measurement points $Q_1$ and $Q_2$ of the wafers which have been processed, for example, through the same PEB unit (for example, the wafer $W_{1-1}$ and the wafer $W_{2-1}$, and the wafer $W_{1-2}$ and the wafer $W_{2-2}$, the wafer $W_{1-3}$ and the wafer $W_{2-3}$, the wafer $W_{1-4}$ and the wafer $W_{2-4}$, the wafer $W_{1-5}$ and the wafer $W_{2-5}$, and the wafer $W_{1-6}$ and the wafer $W_{2-6}$) are added and combined as shown in FIG. 11 to obtain the line width measurement results at the measurement points Q ($Q_1+Q_2$) of the six wafers W which have passed through the PEB units 84 to 89.

According to this embodiment, the line width measurement S2 of each of the lots $L_1$ and $L_2$ is performed at half of the measurement points, so that the time for each line width measurement S2 is decreased. Accordingly, it is possible to increase the processing speed of the wafers W, for example, even under the above-described condition that the completion time T1 of the last line width measurement S2 in the lot $L_1$ is earlier than the completion time T2 of the wafer processing S1 of the wafer W which is first subjected to the line width measurement in the lot $L_2$. More specifically, in the case where six times of line width measurement can be performed in each lot at a normal speed as in the embodiment shown in FIG. 7, the time required for each line width measurement S2 becomes half as shown in FIG. 9 in this embodiment, thus ensuring the same six times of line width measurement S2 in each lot even if the processing is accordingly increased. As described above, according to this embodiment, the throughput in the coating and developing treatment system 1 can be increased.

Note that this embodiment is also applicable to the case where there are a plurality of processing units for performing steps other than the PEB step in the wafer processing S1. In addition, though the plurality of measurement points Q within the wafer are divided into two groups of measurement points $Q_1$ and $Q_2$ in the above-described embodiments, the number of division can be arbitrarily selected.

Preferred embodiments of the present invention have been described above with reference to the accompanying drawings, and the present invention is not limited to the embodiments. It should be understood that various changes or modifications within the spirit as set forth in claims are readily apparent to those skilled in the art, and those should be of course covered by the technical scope of the present invention.

The line width measurement results of the wafers W described above may be used for adjustment of the set temperature of the thermal processing plate in the PEB unit affecting the line width, or may be used for adjustment of the set temperature of a thermal plate in another thermal processing unit, such as a pre-baking unit or a post-baking unit, or adjustment of the set temperature of a cooling plate in a cooling processing unit for cooling the wafer W.

Further, while the line width within the wafer is measured in the above embodiments, other processing states within the wafer, such as the angle of the side wall (the sidewall angle)

in the groove of the resist pattern and the film thickness of the resist pattern may be measured. Furthermore, the present invention is also applicable to the case where measurement of substrates other than the wafer, such as an FPD (Flat Panel Display) and the like.

The present invention is useful in measuring product substrates without decreasing the throughput of the product substrates.

What is claimed is:

1. A substrate measuring method, implemented by a control unit that has been programmed with instructions that cause the control unit to function as a substrate measuring system, the method comprising:

measuring processing states of a plurality of substrates that have been successively transferred from a plurality of lots and subjected to processing, each of the lots including a plurality of substrates, wherein at least one of the substrates of the plurality of substrates in each of the plurality of lots is selected and subjected to substrate measurement, wherein the substrate measurement of two successive lots is performed such that the substrate measurement of a last substrate in a previous lot of the two successive lots has been completed at a time of completion of processing of a substrate which is first subjected to the substrate measurement in a subsequent lot of the two successive lots, wherein if processing recipes for the two successive lots are the same, and there are N processing units, N being a positive integer, which perform the same step in the processing, and the successively transferred substrates are separated and processed in the N processing units, the substrate measurement is performed for the substrates which have been processed in each of the processing units, and wherein the substrate measurement of the N substrates which have been processed in different processing units is performed to perform measurement at some of measurement points of a plurality of measurement points within the substrate of each of the substrates in the substrate measurement of the previous lot of the two successive lots, the measurement at the remaining measurement points of each of the N substrates is performed in the substrate measurement of the subsequent lot of the two successive lots, and measurement results at each of the measurement points of the substrates which have been processed in the same processing unit are then combined.

2. A computer-readable recording medium including computer executable instructions, where the instructions, when executed by a processor in a control unit cause the processor to perform a method comprising:

controlling a substrate measuring method in a substrate processing system including a substrate processing unit and a measuring unit, wherein the substrate measuring method is a method of measuring, by the measuring unit, processing states of a plurality of substrates, the plurality of substrates having been successively transferred from a plurality of lots and subjected to processing, each of the lots including a plurality of substrates, wherein at least one of the substrates of the plurality of substrates in each of the lots is selected and subjected to substrate measurement, wherein the substrate measurement of two successive lots is performed such that the substrate measurement of a last substrate in a previous lot of the two successive lots has been completed at a time of completion of processing of a substrate which is first subjected to the substrate measurement in a subsequent lot of the two successive lots, wherein if processing recipes for the two successive lots are the same, and there are N processing units, N being a positive integer, which perform the same step in the processing, and the successively transferred substrates are separated and processed in the N processing units, the substrate measurement is performed for the substrates which have been processed in each of the processing units, and wherein the substrate measurement of the N substrates which have been processed in different processing units is performed to perform measurement at some of measurement points of a plurality of measurement points within the substrate of each of the substrates in the substrate measurement of the previous lot of the two successive lots, the measurement at the remaining measurement points of each of the N substrates is performed in the substrate measurement of the subsequent lot of the two successive lots, and measurement results at each of the measurement points of the substrates which have been processed in the same processing unit are then combined.

3. A substrate processing system comprising:

a substrate processing unit for successively transferring and processing substrates from a plurality of lots, each of the lots including a plurality of substrates; and a measuring unit, for measuring processing states of the substrates which have been through the processing, wherein at least one of the substrates of the plurality of substrates in each of the lots is selected and subjected to substrate measurement, wherein said system includes a control unit for controlling the substrate measurement of two successive lots such that the measurement of a last substrate in a previous lot of the two successive lots has been completed at a time of completion of processing of a substrate which is first subjected to the substrate measurement in a subsequent lot of the two successive lots, wherein if processing recipes for the two successive lots are the same, and there are N processing units, N being a positive integer, which perform the same step in the processing, and the successively transferred substrates are separated and processed in the N processing units, the substrate measurement is performed for the substrates which have been processed in each of the processing units, and wherein said control unit performs the substrate measurement of the N substrates which have been processed in different processing units to perform measurement at some of measurement points of a plurality of measurement points within the substrate of each of the substrates in the substrate measurement of the previous lot of the two successive lots, performs the measurement at the remaining measurement points of each of the N substrates in the substrate measurement of the subsequent lot of the two successive lots, and then combines measurement results at each of the measurement points of the substrates which have been processed in the same processing unit.

* * * * *